United States Patent
Carlson et al.

(10) Patent No.: US 9,886,275 B1
(45) Date of Patent: Feb. 6, 2018

(54) MULTI-CORE PROCESSOR USING THREE DIMENSIONAL INTEGRATION

(71) Applicants: Andrew Carlson, Westborough, MA (US); Matthew Mattina, Boylston, MA (US)

(72) Inventors: Andrew Carlson, Westborough, MA (US); Matthew Mattina, Boylston, MA (US)

(73) Assignee: Mellanox Technologies Ltd., Yokneam (IL)

( * ) Notice: Subject to any disclaimer, the term of this patent is extended or adjusted under 35 U.S.C. 154(b) by 539 days.

(21) Appl. No.: 14/508,027

(22) Filed: Oct. 7, 2014

Related U.S. Application Data

(60) Provisional application No. 61/888,634, filed on Oct. 9, 2013.

(51) Int. Cl.
*H01L 25/00* (2006.01)
*G06F 9/30* (2006.01)
*H01L 25/065* (2006.01)
*G06F 13/00* (2006.01)

(52) U.S. Cl.
CPC ......... *G06F 9/30134* (2013.01); *G06F 13/00* (2013.01); *H01L 25/0657* (2013.01); *H01L 2225/06513* (2013.01); *H01L 2225/06541* (2013.01)

(58) Field of Classification Search
CPC ............ H04L 20/0657; H01L 25/0657; H01L 2/065755
See application file for complete search history.

(56) References Cited

U.S. PATENT DOCUMENTS

| | | | |
|---|---|---|---|
| 2011/0233775 A1* | 9/2011 | Barth | H01L 25/0657 257/737 |
| 2016/0148901 A1* | 5/2016 | | Alvarez-Icaza Rivera ... H01L 23/50 327/565 |

* cited by examiner

*Primary Examiner* — Zachary K Huson
(74) *Attorney, Agent, or Firm* — Fish & Richardson P.C.

(57) ABSTRACT

Techniques for interconnects structures for a multi-core processor including at least two multi-core integrated circuits include forming at least two multi-core integrated circuits each on a respective substrate into a stack, disposing connections through the stack between a circuit of a first one of the at least two multi-core integrated circuits and a circuit of a second, different one of the at least two multi-core integrated circuits, the integrated circuits arranged in the stack with connections of the first one connected to a receiving pad of the second one.

19 Claims, 7 Drawing Sheets

MULTI-CORE PROCESSOR USING THREE DIMENSIONAL INTEGRATION

PRIORITY CLAIM UNDER 35 U.S.C. §119

This application claims priority under 35 U.S.C. §119 to U.S. Provisional Patent Application Ser. No. 61/888,634, filed Oct. 9, 2013, and entitled "Multi-Core Processor Using Three Dimensional Integration", the entire contents of which are hereby incorporated by reference.

BACKGROUND

This invention relates to processors and more particularly to multi-core processors.

Typically computer systems employ processors. One type of processor is a multicore processor. A multicore processor typically includes plural processor cores on a common chip (e.g., integrated circuit or substrate). Systems comprised of multiple integrated circuits (ICs) typically use printed circuit boards or wire bonding to connect the integrated circuits. Connections that employ printed circuit boards or wire bonding are limited in their minimum pitch (center to center spacing between conductors) that constrains the number of input/output (I/O) connections that can be made to an IC of a given size.

SUMMARY

A higher number of connections is desirable to increase data rates between devices, e.g., multicore processors having plural processor cores on common integrated circuits or substrates (chips). Connections are often a speed constraint in system performance. Increasing the size of the integrated circuit to accommodate more I/O connections however, comes at a penalty of reducing the number of dies that can be fabricated on a wafer and also can result in lower yields as it is more likely that a larger die will have a processing error. Thus, both of these considerations can increase the cost of manufacturing the multi-core processor.

Additionally, printed circuit board and wire bond connections have a relatively large parasitic capacitance and inductance (parasitics) compared to on-chip interconnects. These parasitics limit the maximum frequency of connection, which can be a further constraint on the maximum data rate of the system. Furthermore, connections with greater parasitics require more power to operate.

In addition to the issues with inter-chip communication as discussed above, communication between elements on a single chip is often constrained to two physical dimensions. Communication time is proportional to the wire length and planar distance between communicating entities (typically cores).

According to an aspect, a method of manufacturing a multi-core processor including at least two multi-core integrated circuits includes forming at least two multi-core integrated circuits each on a respective substrate into a stack, disposing connections through the stack between a circuit of a first one of the at least two multi-core integrated circuits and a circuit of a second, different one of the at least two multi-core integrated circuits, with the first the second of at least two multi-core integrated circuits arranged in the stack to have the connections of the first one of the at least two multi-core integrated circuits connect to a receiving pad of the second one of the at least two multi-core integrated circuits, and configuring the first and second of the at least two multi-core integrated circuits to communicate directly through connections made through the stack, without relying on peripheral I/O connections on edges of the integrated circuits.

According to an additional aspect, a method of communicating among cores in a multi-core processor including at least two multi-core integrated circuits includes configuring a first set of devices in two multi-core integrated circuits arranged in a stack to communicate directly with each other without sending signals to on-chip conductors, by solely sending signals directly to each other through connections made through corresponding substrates supporting the first and second multi-core integrated circuits, sending a packet between at least two cores in a first and second multi-core integrated circuits arranged in the stack, at least a first one of the at least two multi-core integrated circuits at a first level of the stack such that first one of the at least two multi-core integrated circuits communicates the packet with at least a second, different one of the at least two multi-core integrated circuits at a second, different level of the stack, directly, without relying on peripheral I/O connections and the on-chip mesh network of the first and second integrated circuits for sending the packet between the at least two cores, with sending the packet to a destination one of the two cores based on an address that contains a unique identifier for the core within the stack.

According to an additional aspect, a multi-core processor including at least two multi-core integrated circuits includes at least two multi-core integrated circuits each on a corresponding substrate, the substrates arranged in a stack with a first one of the at least two multi-core integrated circuits at a first level of the stack and a second one of the at least two multi-core integrated circuits at a second, different level of the stack, connections through the stack to directly connect circuits of the first and second ones of the at least two multi-core integrated circuits, and processors of the first and second of the at least two multi-core integrated circuits configured to communicate messages to circuits of the first and second of the at least two multi-core integrated circuits, directly through the connections through the stack, without relying on peripheral I/O connections at edges of the multi-core integrated circuit.

One or more of the aspects may provide one or more of the following advantages.

Aspects provide in effect a higher number of chip connections that can lead to an increase in data rates between multicore processors having plural processor cores on common integrated circuits or substrates. These aspects minimize speed constraints resulting from off chip connections and accommodate more effective connections without increasing the size of the integrated circuit, thus avoiding concomitant drawbacks of reducing the number of dies that can be fabricated on a wafer and lower yields to simply provide more I/O connections on a larger chip. Aspects also minimize printed circuit board and wire bond connections with their relatively large parasitic capacitance and inductance (parasitics) compared to on-chip interconnects. In addition aspects improve inter-chip communication between elements by extending network on-chip routing to three dimensions, where the average distance between elements is reduced in some instances. This decrease in distance directly leads to lower latency and lower network occupancy for the circuit such as a multicore processor.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
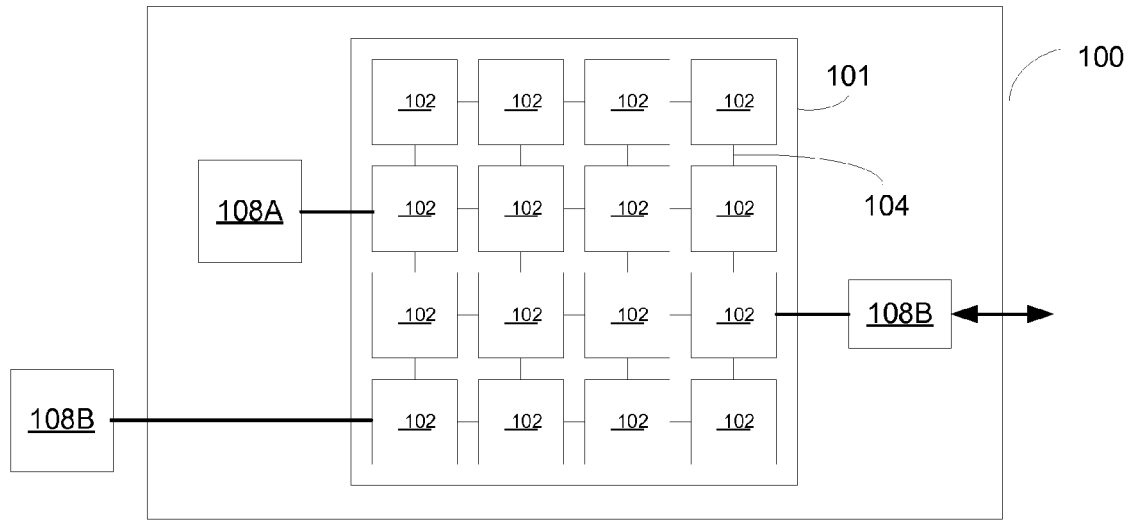
FIG. 1 is a block diagram of a tiled multicore processor integrated circuit.

Referring to FIG. 1, an integrated circuit 100 (or "chip") includes an array 101 of interconnected tiles 102. Each of the tiles 102 is a functional unit that includes a processor and a switch that forwards data from other tiles to the processor and to switches of other tiles over data paths 104. The switch is coupled to the processor so that data can be sent to or received from processors of other tiles. The integrated circuit 100 includes other on-chip circuitry such as input/output (I/O) interface circuitry to couple data in and out of the circuit 100, and clock distribution circuitry to provide clock signals to the processors of the tiles.

The integrated circuit 100 shown in FIG. 1 includes a two-dimensional array 101 of rectangular tiles with data paths 104 between neighboring tiles to form a mesh network. The data path 104 between any two tiles can include multiple wires to support parallel channels in each direction. Optionally, specific sets of wires between two tiles can be dedicated to different mesh networks that can operate independently. Alternative network configurations include networks having paths that extend to diagonal neighbors or to tiles that are separated by multiple rows and/or columns. Other configurations include higher dimensional mesh topologies. For example, multiple layered integrated circuits or other three-dimensional configurations can be used to form networks in which the connections form a cube of network nodes.

The data paths 104 from one or more tiles at the edge of the network can be coupled out of the array of tiles 101 (e.g., over I/O pins) to an on-chip device 108A, an off-chip device 108B, or a communication channel interface 108C, for example. Multiple wires of one or more parallel channels can be multiplexed down to a fewer number of pins or to a serial channel interface. For example, the wires for one or more channels can be multiplexed onto a high-speed serial link (e.g., SerDes, SPIE4-2, or SPIE5) or a memory controller interface (e.g., a memory controller for DDR, QDR SRAM, or Dynamic RAM). The memory controller can be implemented off-chip or in logic blocks within a tile or on the periphery of the integrated circuit 100.

The following exemplary implementations are described in the context of tiles that have the same structure and functionality. Alternatively there can be multiple "tile types" each having different structure and/or functionality. For example, tiles that couple data off of the integrated circuit 100 can include additional circuitry for I/O functions.

Figure 2A:
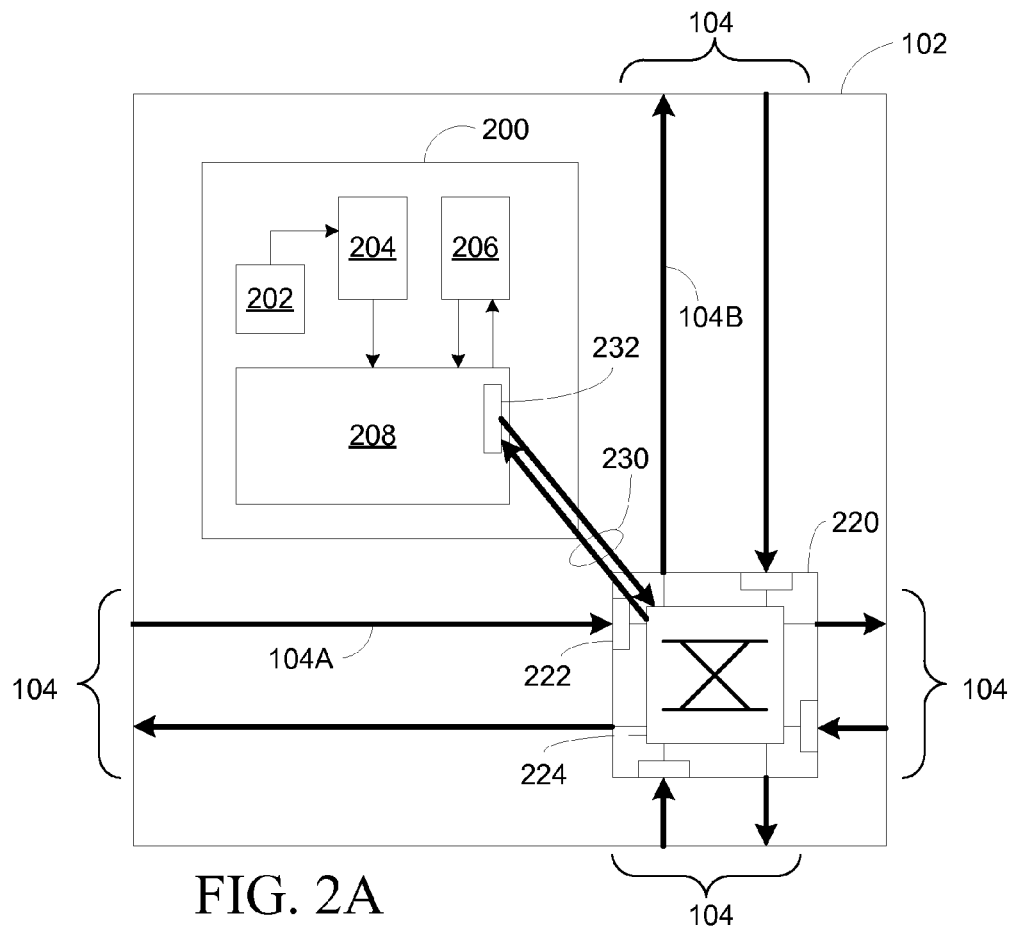
FIGS. 2A and 2B are block diagrams of a tile and an included a switch for a core processor.

Referring to FIG. 2A, a tile 102 includes a processor 200, a switch 220, and sets of incoming wires 104A and outgoing wires 104B that form the data paths 104 for communicating with neighboring tiles. The processor 200 includes a program counter 202, an instruction memory 204, a data memory 206, and a pipeline 208. Either or both of the instruction memory 204 and data memory 206 can be configured to operate as a cache for off-chip memory. The processor 200 can use any of a variety of pipelined architectures. The pipeline 208 includes pipeline registers, functional units such as one or more arithmetic logic units (ALUs), and temporary storage such as a register file. The stages in the pipeline 208 include, for example, instruction fetch and decode stages, a register fetch stage, instruction execution stages, and a write-back stage. Whether the pipeline 208 includes a single ALU or multiple ALUs, an ALU can be "split" to perform multiple operations in parallel. For example, if the ALU is a 32-bit ALU it can be split to be used as four 8-bit ALUs or two 16-bit ALUs. The processor 200 can include other types of functional units such as a multiply accumulate unit, or a vector unit. The processor 200 can be multithreaded and/or have capabilities of a Very Long Instruction Word (VLIW) processor, a superscalar processor, or a vector processor.

The switch 220 includes input buffers 222 for temporarily storing data arriving over incoming wires 104A, and switching circuitry 224 (e.g., a crossbar fabric) for forwarding data to outgoing wires 104B or the processor 200. The input buffering provides pipelined data channels in which data traverses a path 104 from one tile to a neighboring tile in predetermined number of clock cycles (e.g., a single clock cycle). This pipelined data transport enables the integrated circuit 100 to be scaled to a large number of tiles without needing to limit the clock rate to account for effects due to wire lengths such as propagation delay or capacitance. (Alternatively, the buffering could be at the output of the switching circuitry 224 instead of, or in addition to, the input.)

A tile 102 controls operation of a switch 220 using either the processor 200, or separate switch processor dedicated to controlling the switching circuitry 224. Separating the control of the processor 200 and the switch 220 allows the processor 200 to take arbitrary data dependent branches without disturbing the routing of independent messages passing through the switch 220.

In some implementations, the switch 220 includes a switch processor that receives a stream of switch instructions for determining which input and output ports of the switching circuitry to connect in any given cycle. For example, the switch instruction includes a segment or "sub-instruction" for each output port indicating to which input port it should be connected. In other implementations, the processor 200 receives a stream of compound instructions with a first instruction for execution in the pipeline 208 and a second instruction for controlling the switching circuitry 224.

The switch instructions enable efficient communication among the tiles for communication patterns that are known at compile time. This type of routing is called "static routing." An example of data that would typically use static routing are operands of an instruction to be executed on a neighboring processor.

The switch 220 also provides a form of routing called "dynamic routing" for communication patterns that are not necessarily known at compile time. In dynamic routing, circuitry in the switch 220 determines which input and output ports to connect based on header information in the data being dynamically routed. A tile can send a message to any other tile by generating the appropriate address information in the message header. The tiles along the route between the source and destination tiles use a predetermined routing approach (e.g., shortest Manhattan Routing). The number of hops along a route is deterministic but the latency depends on the congestion at each tile along the route.

Examples of data traffic that would typically use dynamic routing are memory access traffic (e.g., to handle a cache miss) or interrupt messages.

The dynamic network messages can use fixed length messages, or variable length messages whose length is indicated in the header information. Alternatively, a predetermined tag can indicate the end of a variable length message. Variable length messages reduce fragmentation.

The switch 220 can include dedicated circuitry for implementing each of these static and dynamic routing approaches. For example, each tile has a set of data paths, buffers, and switching circuitry for static routing, forming a "static network" for the tiles; and each tile has a set of data paths, buffers, and switching circuitry for dynamic routing, forming a "dynamic network" for the tiles. In this way, the static and dynamic networks can operate independently. A switch for the static network is called a "static switch"; and a switch for the dynamic network is called a "dynamic switch." There can also be multiple static networks and multiple dynamic networks operating independently. For example, one of the dynamic networks can be reserved as a memory network for handling traffic between tile memories, and to/from on-chip or off-chip memories. Another network may be reserved for data associated with a "supervisory state" in which certain actions or resources area reserved for a supervisor entity.

As described above, the switch 220 is coupled to the processor 200 over processor coupling wires 230. For fast (e.g., low latency) communication between tiles of neighboring processors, the coupling wires 230 can be integrated directly into the pipeline 208. The processor 200 can communicate with the switch 220 using distinct operation codes (op codes) to distinguish between accesses to the static and dynamic network ports. Alternatively, the instructions can use register names to refer to switch ports.

For example, the processor can send or receive data by writing to or reading from a register interface that is directly mapped to the input buffers 222 of the switch 220. For data going to or coming from the processor 200, a switch instruction indicates that the switch 220 should couple data to or from a selected register or bypass path of the pipeline 208 over a register mapped pipeline integrated switch interface 232. This pipeline integration allows data to be available to the switch 200 the moment an instruction is executed and the register value is available. In the next cycle the same data could appear at an input buffer of another tile.

Figure 2B:
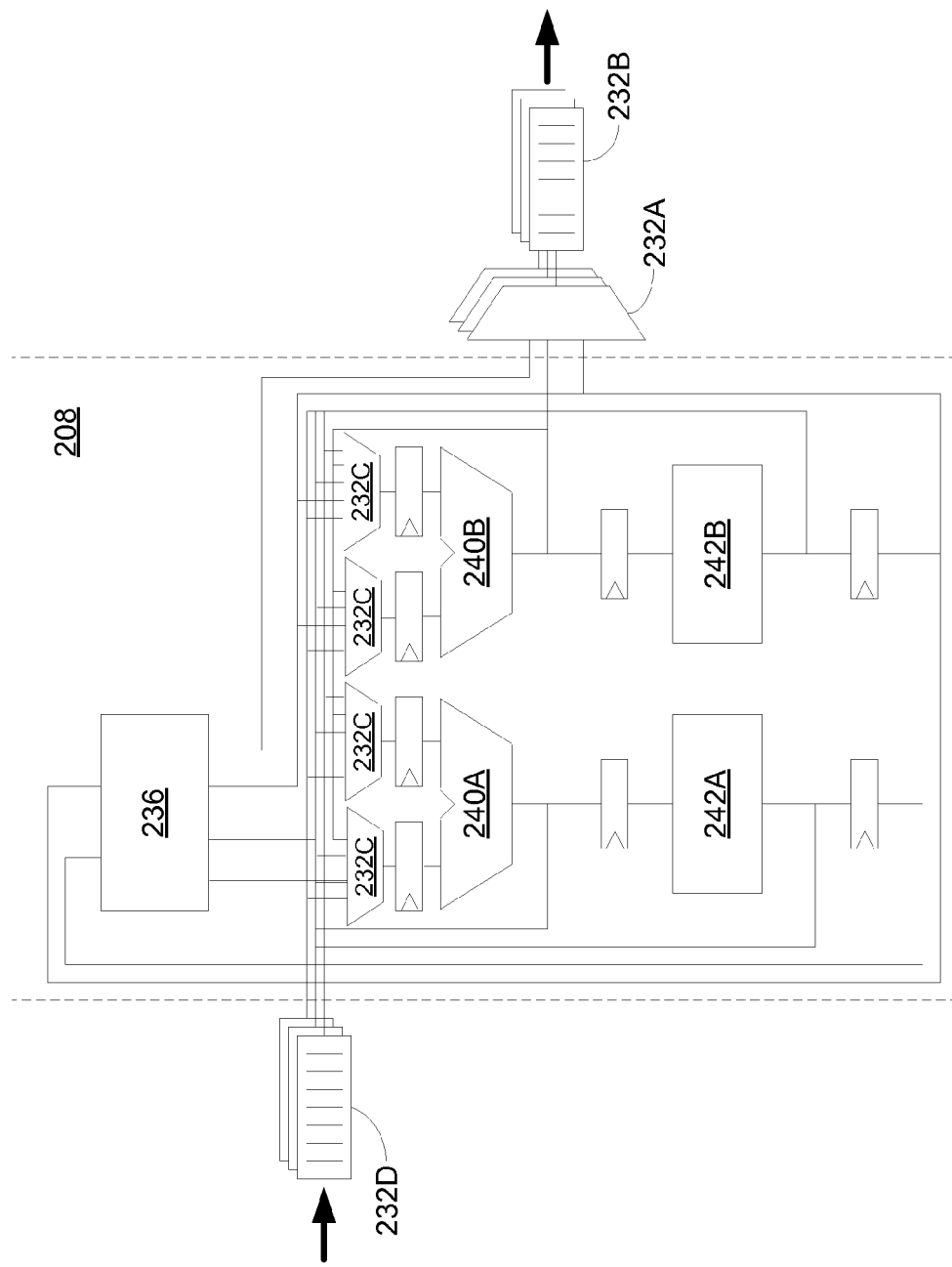

Referring to FIG. 2B, a register mapped pipeline integrated switch interface 232 includes a set of multiplexers 232A and output buffers 232B coupled to different output ports of the static or dynamic switch. The switch interface also includes a set of multiplexers 232C that select data from a register file 236 or any of a set of input buffers 232D coupled to different input ports of the static or dynamic switch. The multiplexers 232C feed the inputs to logic units 240A and 240B. The output buffers 232B and input buffers 232D are mapped to the name space of the register file 236. When the processor 200 reads from a register name mapped to a given switch port, data is taken from the corresponding input buffer 232D. When the processor 200 writes to a register name mapped to a given switch port, data is inserted into the corresponding output buffer 232B. The multiplexers 232A are able to select data from any pipeline stage (e.g., before or after the logic units 240A and 240B, or before or after functional units 242A and 242B) as soon as the value is available. If the processor 200 loads an instruction to read from an empty input buffer 232D or to write to a full output buffer 232B, the processor 200 will stall until it is able to proceed.

U.S. patent application Ser. No. 12/885,957 entitled: "Managing Shared Resources In An Operating System" filed: Sep. 20, 2010; and U.S. patent application Ser. No. 13/280,927 entitled: "Computing In Parallel Processing Environments" filed: Oct. 25, 2011 are incorporated herein by reference in their entirety.

A multi-core IC is configured as a 3D IC comprising at least two multi-core ICs, such that cores from different ICs communicate with each other directly, without relying on peripheral I/O connections. That is, communicating without relying on peripheral I/O connections uses inter-level connections (discussed below) that are between individual cores or core to cache, and which directly connect individual cores or a core to a cache. These techniques (discussed below) obviate the need for connecting chips together with package pins and I/O.

In one technique, the multi-core integrated circuits have identical layouts, and are programmed to operate with a variable number of multi-core integrated circuits in a stack (not shown) of, e.g. 2 or 3 or even 1 (i.e., the single IC operates without being part of a 3D IC stack). The multi-core ICs may have similar process targeting or skewed process targeting.

In another technique, the multi-core IC layouts are not identical. For example, the multi-core IC may have different I/O configurations or may have different numbers or types of cores among the multiple ICs.

A multicore processor is manufactured as a chip containing multiple processing engines or cores. Using multiple cores to process applications can provide greater computing throughput and also lower power. There are many challenges to building multicore processors. These include the challenges of how to connect the cores to each other efficiently, how to manage data sharing between the cores, how to supply data from input-output devices to the cores in a coherent manner, and how to construct operating systems for multicore processors.

Thus, connections of the point-to-point network, especially the mesh network, or a ring network provides networks with switches arranged in a 3D grid pattern in which neighboring switches are connected to each other in vertical arrangement in addition to the mesh connecting the cores in a rectangular tiled pattern.

Bus based multicore chips use a bus to connect the cores, but buses can be a throughput bottleneck and may also consume excessive amounts of power. An alternative approach to connect the cores is to use a point-to-point network such as a mesh network or a ring network. Networks such as a mesh have switches arranged in a grid pattern in which neighboring switches are connected to each other. When the cores include a switch component for a network such as a mesh, the cores can be laid out in a simple rectangular tiled pattern. Such multicore chips are called tiled multicore processors, as discussed above. Because the conductor paths are short in tiled multicore processors, signals travel short distances when neighboring cores need to communicate. Tiled multicore processors generally consume lower power than bus based multicore processors.

Figure 3:
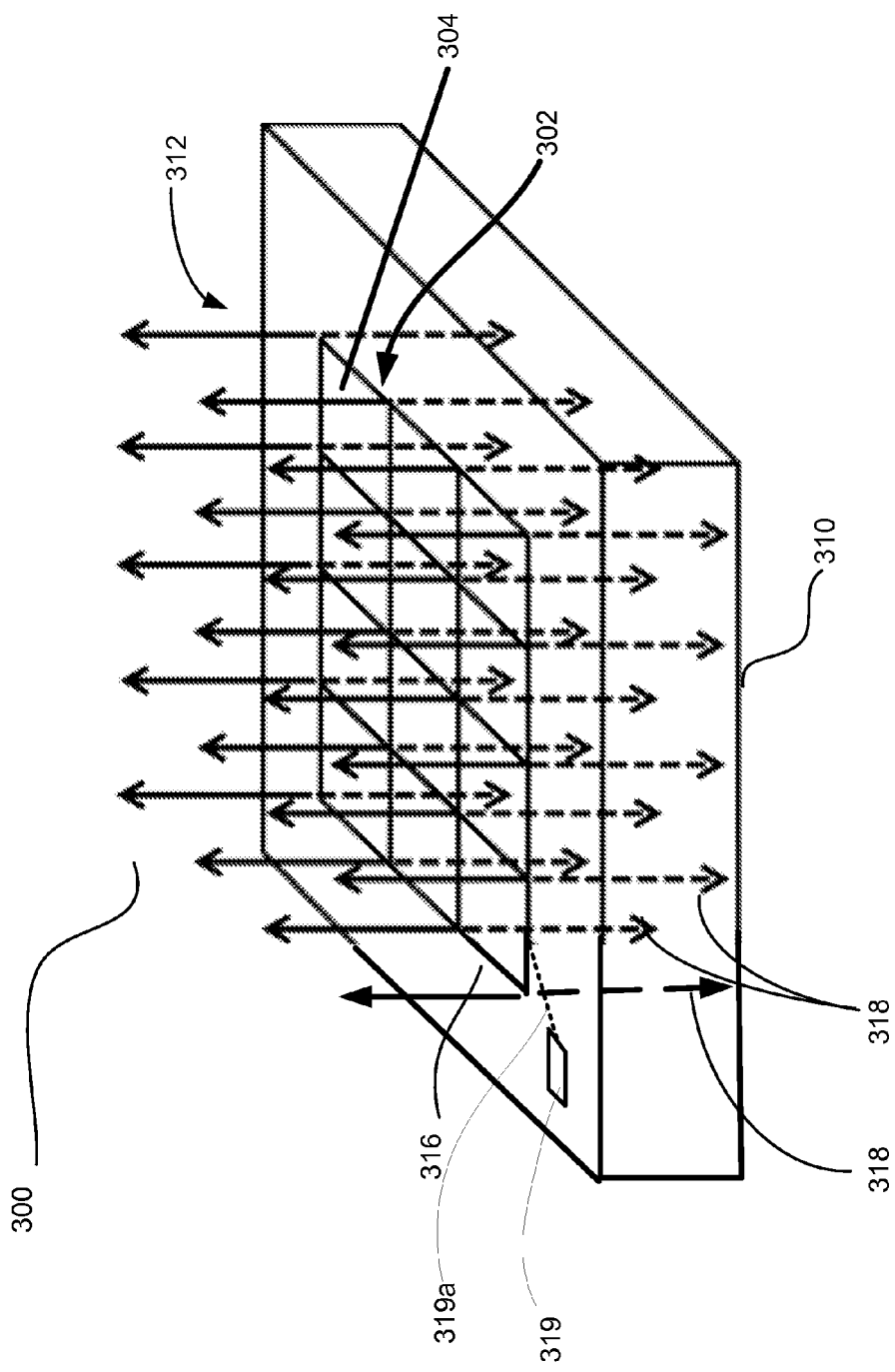
FIGS. 3-6 are diagrammatical view showing portions of substrates and interconnection structures.

Referring now to FIG. 3, an integrated circuit 300 (or "chip") includes an array 302 of interconnected tiles 304 disposed on a substrate 310. Each of the tiles 304 is a functional unit that includes a processor (or "processor core") and a switch (not shown in FIG. 3 but the same as or similar to those mentioned in conjunction with FIGS. 1-2B)

that forwards data from other tiles to the processor and to switches of other tiles over data paths.

An exemplary integrated circuit for discussion below includes processors, cores and switches as the multicore processor discussed in FIGS. 1, 2A and 2B, above. The switch is coupled to the processor so that data can be sent to or received from processors of other tiles over the communication fabric formed by the switches and data paths, as discussed in FIGS. 1, 2A, 2B.

The integrated circuit 300 includes other on-chip circuitry such as input/output (I/O) interface circuitry to couple data in and out of the circuit 300, and clock distribution circuitry to provide clock signals to the processors of the tiles, as mentioned in FIGS. 1, 2A and 2B, above (all not shown in FIG. 3). Cores in the multi-core IC communicate with each other via a network of interconnect structures with nodes regularly distributed in close proximity to the core.

Still referring to FIG. 3, three dimensional interconnect structures 312 are shown. These three dimensional interconnect structures 312 include on-chip wiring 316 forming a grid, with the on-chip wiring running generally parallel to the substrate, and also include orthogonal, 3D connections 318 that are disposed through the substrate. The orthogonal, 3D connections 318 are provided by silicon vias (TSVs), copper pillars (e.g., flip chip bumps), copper nails (e.g., through-silicon via (TSV) technology), or other suitable conductor technologies. FIG. 3 shows an exemplary 3D IC with 20 nodes (intersections of the on-chip wiring 316) arranged in five columns and four rows, with on-chip interconnects running between them to form grid 302, and 3D interconnects that may connect to another 3D IC stacked above or below (not shown in FIG. 3).

A core communicates with another core by sending a packet comprising the data to be sent and an address of the destination core. Nodes within the network of interconnects 312, route the packet to the destination core based on the address. The address contains a unique identifier for the core within the 3D IC stack (not shown), for example, (X, Y, Z) describes a core on the $X^{th}$ chip in the 3D IC stack, in the $Y^{th}$ row, on the $Z^{th}$ column. Each IC in the 3D IC stack is programmed with its position in the stack once at assembly, in a non-volatile way, such as with fuses or other memory elements 319. These elements 319 are programmed to include communication path 319a information that sends position information to the processor cores to indicate position of the 3D IC in the stack. This position information is communicated to the network of interconnects, so that the nodes in the network can route packets accurately.

Figure 3A:
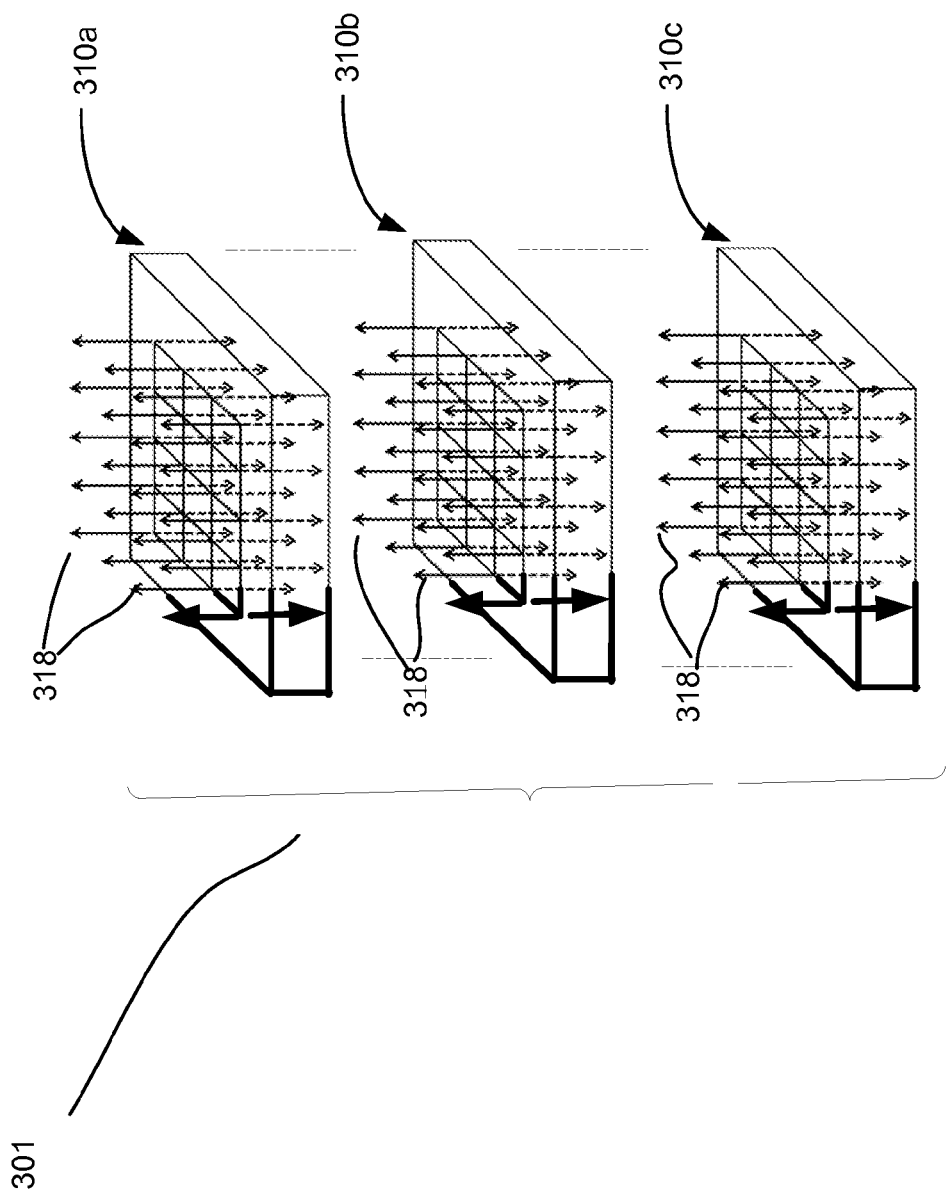
FIG. 3A is a diagrammatical, exploded view showing a stack of substrates and an interconnection structure as in FIG. 3.

Referring now to FIG. 3A, a generally arrangement of substrates 300 in a stack 301 with the substrates 310 having interconnect structures 312 corresponding to the circuit shown in FIG. 3 is shown. The stack 301 includes three substrates 310a-301c a top substrate 310a, middle substrate 310b, and bottom substrate 301c, with interconnects 318. Thus, the three multi-core integrated circuits are each on respective substrates 310a-301c and are arranged in the stack 301, with a first one of the multi-core integrated circuits substrates 310a at a first level of the stack 310, connected directly to the second one of multi-core integrated circuits on substrate 310b in direct communication with the second, one of the multi-core integrated circuits directly through the connections 318 made through the stack 310, without relying on peripheral I/O connections on the integrated circuits.

Figure 4:
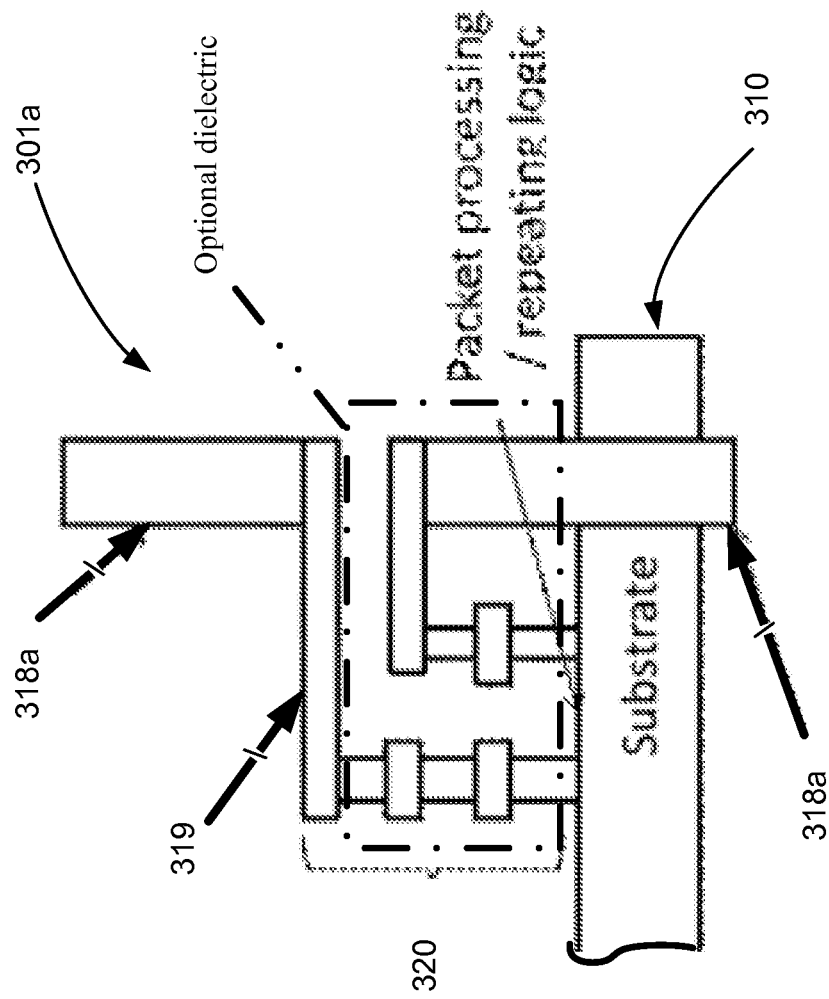

Referring now to FIG. 4, in one embodiment the multi-core ICs in a 3D IC stack 301a share an identical layout. An advantage of this is that it minimizes costs associated with designing, manufacturing, and testing the multi-core IC, since these multi-core IC's only need to support a single physical configuration.

If the 3D interconnects 312 allows for electrical insulation (dielectric) between the top and bottom of the 3D IC (for example in the metallization above the substrate), the 3D connections generally 318a can be limited to the adjacent chip to reduce parasitic capacitance, resistance and inductance. The 3D interconnects would connect with on chip metallization including a planar conductor 319 and through metallization 320. In such a fabrication approach, packets from source cores are communicated by travelling through more than one chip and repeated by each chip along the path to destination cores. Power connections can be made using on-chip metallization to connect to a via structure, straight through the substrates.

If the 3D interconnect technology does not allow for dielectric separation between the top and bottom of the chip 300, but rather has a continuous conductor straight through, one technique is to treat the 3D interconnect as a shared I/O pin. In this case, driver circuitry on the substrate (not shown) that drives signals on that shared pin would be a tri-state driver circuit, meaning that the driver circuit has three states, a high logic one state, a low logic zero state and an open circuit (i.e. high impedance) state. Coordination would be provided among the other ICs in the stack, so as to avoid conflicts by two IC's attempting to use the shared pin at the same time. The advantages of this approach are simplicity of integration and relatively low resistance for supplying power to chips in the stack.

Figure 5:
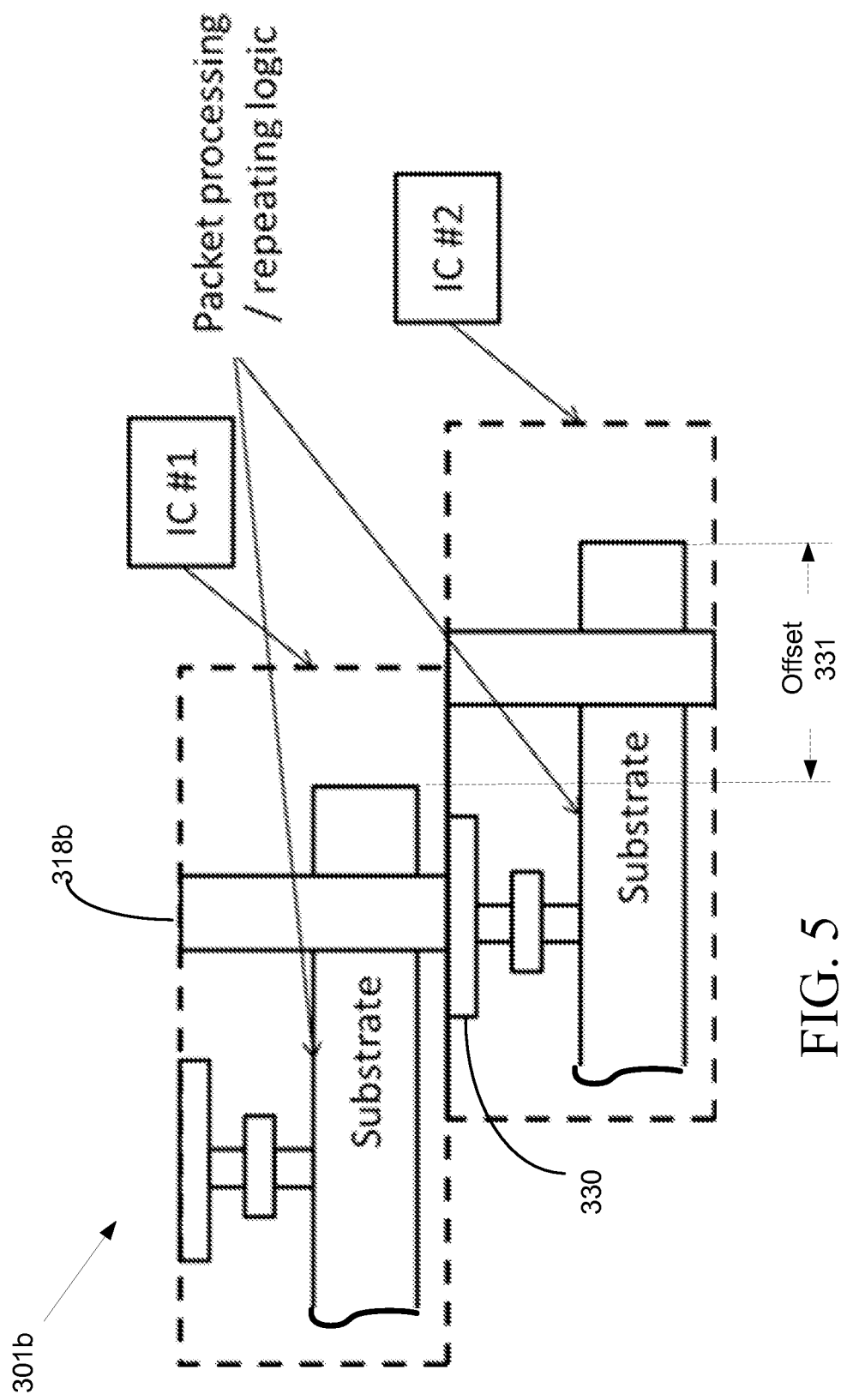

Referring to FIG. 5, in an alternative stack 301b, if the number of chips in the 3D IC stack is small, a slight offset 331 can be made during stacking, such that a 3D interconnect 318b from one chip lands on a receiving pad 330 in the metallization of the next chip. FIG. 5 shows a 3D IC with two ICs having identical layouts, using an offset 331 in the stacking to reduce parasitics. Packet processing and repeating logic determine whether the packet gets communicated onto the next chip. The minimum signal connection pitch is effectively doubled in one direction, but the pitch in the orthogonal direction remains at a minimum. The advantage of this technique, over treating the 3D interconnect as a shared I/O pin, is that parasitic capacitance, inductance, and resistance will be less, enabling higher frequency signals and lower power operation.

Figure 6:
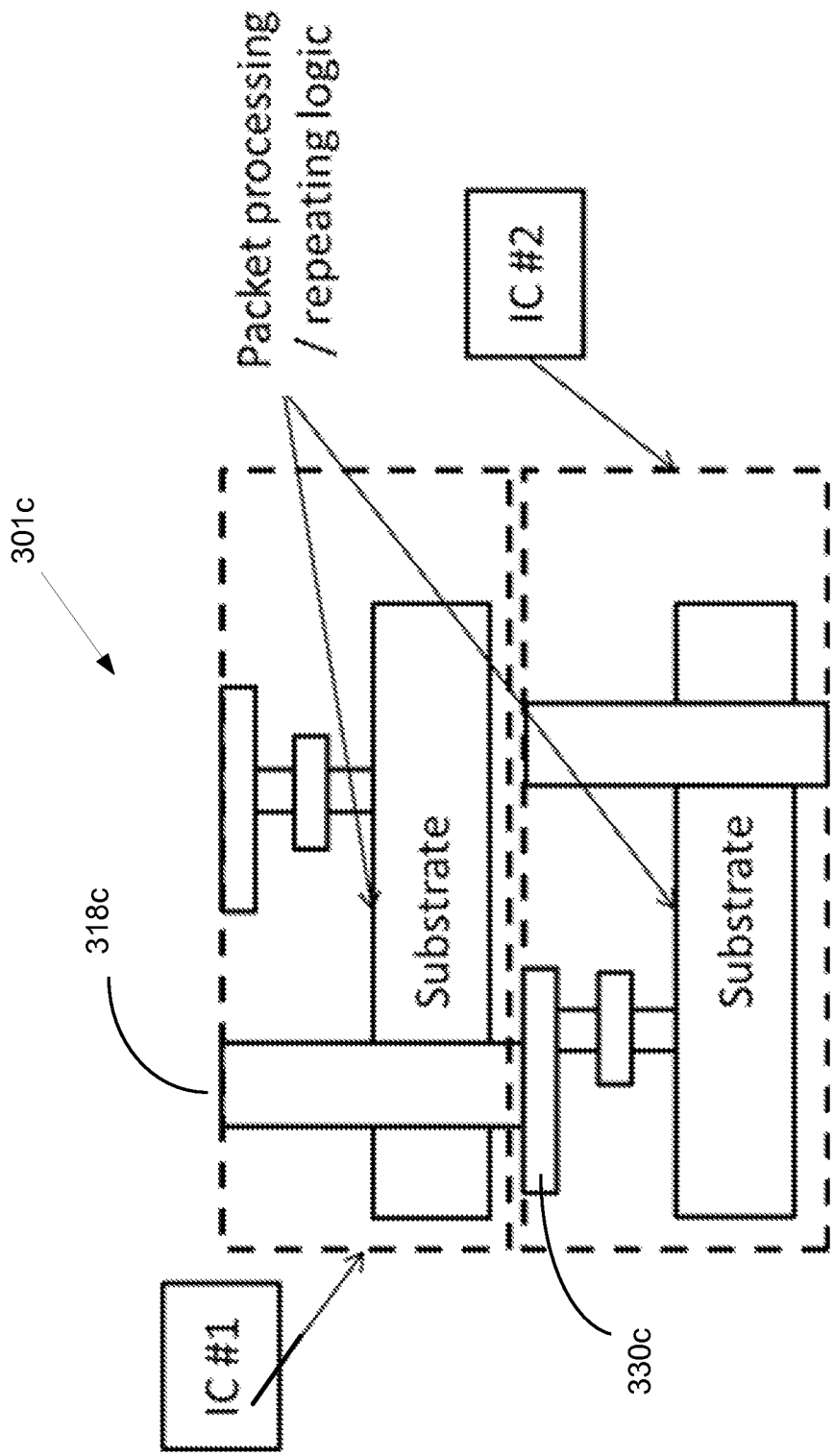

Referring to FIG. 6, in another alternative stack 301c is shown with a 3D interconnect 318c through the IC, using ICs with small layout differences. For example, a combination of receiving pad 330c and 3D interconnect 318c could be mirrored in two different ICs, and configured to have the 3D interconnect 318c of IC #1 land on a receiving pad 330c of IC #2 with no misalignment in the 3D IC stack 301c.

This approach has the same speed and power benefits from reduced parasitics and a further manufacturing benefit of alignment in the 3D IC stack. It does require a second IC physical configuration. However, any physical configuration differences could be constrained to a single metal layer to minimize cost. Although attention has been given here to the 3D connections in a network of cores, the same techniques could also be applied to any 3D connections, such as power, peripheral I/O, and others not mentioned here.

For ICs with different layouts, network efficiency will be greatest when the nodes of the chips are reasonably aligned, such as when the cores and node circuitry are similarly sized on both chips. However, it is not necessary that the ICs be identically sized. For example, a small IC of a few cores can be placed in a 3D IC stack above a large IC of many cores.

An advantage of this approach is that it allows for expansion and customization of a product portfolio. If a small IC has N cores in comparison to a large IC that has 3N cores, a 3D IC stack of N, 2N, 3N, 4N, or 6N cores could be built with only one or two ICs, whereas without 3D IC, the product would be limited to only N or 3N cores.

Furthermore, it is not necessary that the cores be identical in the 3D IC stack. For example, process targeting could be used to skew the IC with the greatest heat dissipation to a faster, more powerful point, and the IC with the worst heat dissipation could be skewed to a slower, less powerful point. Process targeting could be applied to either identical or different core layouts. In the case of different core layouts, the cores of one IC may include one set of specific optimizations to the circuitry, and the cores of a second IC a different set of optimizations, such that the combination in a 3D IC is complementary.

Exemplary Configurations

One configuration has a lower chip (Z0) with a mesh network, processors and banks of an L3 cache and an upper chip (Z1), with a cache controller, a large L4 cache memory having plural banks of memory. In this configuration, banks of the L4 cache are located "above" each of the banks of the L3 cache. A cache miss in an L3 bank on chip (Z0) is routed directly up to the cache controller on the upper chip Z1 for processing and retrieving of data from one of the L4 banks, with the routing of the cache miss using a path that does not rely on peripheral I/O connections on edges of the integrated circuits.

Another configuration would have a mesh network extended into a 3D structure over two (or more) stacked substrates, in order to transform an X-Y mesh into an X-Y-Z mesh. Each switch in a core processor would be able to physically route packets directly up and down through the interconnect 318 without relying on peripheral I/O connections on edges of the integrated circuits, in addition to routing packets in N-S-E-W directions over the on chip mesh network.

A number of embodiments of the invention have been described. Nevertheless, it will be understood that various modifications may be made without departing from the spirit and scope of the invention. For example, the above description has focused on 3D IC stacks of two ICs for simplicity; however, it will be readily apparent to someone skilled in the art that this can be extended to cover any arbitrary number of ICs in the stack. Accordingly, other embodiments are within the scope of the following claims.

What is claimed is:

1. A method of manufacturing a multi-core processor comprising at least two multi-core integrated circuits, the method comprises:
   providing at least two multi-core integrated circuits each on a respective substrate into a stack, with a first one of the at least two multi-core integrated circuits having a mesh network, processors, cache controller, and an L3 cache memory having plural L3 banks of cache memory, and a second one of the at least two multi-core integrated circuits having a cache controller and an L4 cache memory, with the L4 cache memory being larger in storage capacity than the L3 cache memory, and the L4 cache memory having plural L4 banks of memory located in the stack above the plural banks of the L3 cache;
   routing a cache miss in an L3 bank in the L3 cache directly up to the cache controller on the second one of the at least two multi-core integrated circuits for processing and retrieving of data from one of the L4 banks through;
   orthogonal connections disposed through the stack between a circuit of a first one of the at least two multi-core integrated circuits and a circuit of a second, different one of the at least two multi-core integrated circuits, with the first and the second of the at least two multi-core integrated circuits arranged in the stack to have the connections of the first one of the at least two multi-core integrated circuits connect to the mesh network of the second one of the at least two multi-core integrated circuits; and
   configuring the first and second of the at least two multi-core integrated circuits to communicate directly through a grid interconnect formed from the on chip mesh networks of the at least two multicore integrated circuits and the orthogonal connections made through the stack, with the routing of the cache miss using a path that does not rely on peripheral I/O connections on edges of the integrated circuits.

2. The method of claim 1 further comprising:
   providing in the stack a plurality of multi-core integrated circuits, the plurality including the first and second multi-core integrated circuits, with the first and second multi-core integrated circuits having an identical layout;
   programming the first and second multi-core integrated circuits to operate with a variable number of multi-core integrated circuits in the stack.

3. The method of claim 1 wherein the connections through the stack are through the first and second substrates with the two multi-core integrated circuits being offset from each other and one of the two multi-core integrated circuits having a receiving pad to receive the interconnect from the other one of the two multi-core integrated circuits.

4. The method of claim 1 wherein the connections through the stack are vias or copper pillars or copper nails.

5. The method of claim 1 wherein configuring further comprises:
   configuring a first set of devices in the two multi-core integrated circuits to communicate directly with each other without sending signals to the on-chip conductors, by solely sending signals directly to each other through the connections through the stack between the circuit in the first and the circuit in the second multi-core integrated circuits.

6. A method of communicating among cores in a multi-core processor comprising at least two multi-core integrated circuits, the method comprises:
   configuring a first set of devices in each of two multi-core integrated circuits arranged in a stack, a first one of the two multi-core integrated circuits having a mesh network, processors, cache controller, and an L3 cache memory having plural L3 banks of cache memory, and a second one of the two multi-core integrated circuits having a cache controller and an L4 cache memory, with the L4 cache memory being larger in storage capacity than the L3 cache memory, and the L4 cache memory having plural L4 banks of memory located in the stack above the plural banks of the L3 cache;
   routing a cache miss in the L3 cache directly up to the cache controller on the second one of the two multi-core integrated circuits for processing and retrieving of data from one of the L4 banks with routing occurring over orthogonal connections through the stack between a circuit of the first one of the two multi-core integrated circuits and a circuit of the second one of the two multi-core integrated circuits, using a path that does not rely on peripheral I/O connections on edges of the integrated circuit.

7. The method of claim 6 wherein the address is of the form (X, Y, Z) where the address describes a core on the X chip in the stack, the Y row, and the Z column.

8. The method of claim 6 wherein each IC in the stack is programmed with its position in the stack once at assembly, in a non-volatile manner.

9. The method of claim 6 wherein packet processing and repeating logic determines whether the packet gets communicated onto the next chip.

10. A multi-core processor comprising at least two multi-core integrated circuits comprises:
  at least two multi-core integrated circuits each on a corresponding substrate, the substrates arranged in a stack with a first one of the at least two multi-core integrated circuits having a mesh network, processors, cache controller, and an L3 cache memory having plural L3 banks of cache memory, and at a first level of the stack and a second one of the at least two multi-core integrated circuits having a cache controller and an L4 cache memory, with the L4 cache memory being larger in storage capacity than the L3 cache memory, and the L4 cache memory having plural L4 banks of memory located above the plural banks of the L3 cache and at a second, different level of the stack, with the at least two multi-core integrated circuits each comprising an on chip grid parallel to the substrate;
  orthogonal connections through the stack to directly connect circuits of the first and second ones of the at least two multi-core integrated circuits with the on chip grids; and
  processors of the first and second of the at least two multi-core integrated circuits configured to communicate messages to circuits of the first and second of the at least two multi-core integrated circuits, with a cache miss in an L3 cache being routed directly up to the cache controller on the second one of the at least two multi-core integrated circuits for processing and retrieving of data from one of the L4 banks directly through a grid interconnect formed from the on chip mesh networks of the at least two multicore integrated circuits and the orthogonal connections through the stack, using a path that does not rely on peripheral I/O connections at edges of the multi-core integrated circuit.

11. The processor of claim 10 further comprising:
  packet processing and repeating logic to determine whether a packet gets communicated onto a subsequent chip.

12. The processor of claim 10 wherein the multi-core processor has a first set of devices in the two multi-core integrated circuits configured to communicate directly with each other without sending signals to an on-chip mesh network, by solely sending signals directly to each other over the connections through the stack.

13. The processor of claim 10 wherein the multi-core processor has the two multi-core integrated circuits offset in the stack and one of the two multi-core integrated circuits having a receiving pad to receive the interconnect from the other one of the two multi-core integrated circuits.

14. The processor of claim 10 wherein the multi-core processor has the two multi-core integrated circuits having identical chip layouts.

15. The processor of claim 10 wherein the multi-core processor has dielectric between the two multi-core integrated circuits in the stack.

16. The processor of claim 10 wherein the connections through the stack are vias or copper pillars or copper nails.

17. The processor of claim 10 wherein the multi-core processor has the two multi-core integrated circuits offset in the stack with the connections made during stacking, such that an interconnect from one chip lands on a receiving pad in the metallization of a next chip in the stack.

18. The processor of claim 10 wherein the multi-core processor has the two multi-core integrated circuits having identical chip layouts with the connections made by a combination of a receiving pad and an interconnect mirrored in two different ICs, and configured to have the interconnect of a first one of the chips land on a receiving pad a second one of the chips with no misalignment in the stack.

19. The processor of claim 10 wherein the connection has a continuous conductor straight through with the connection being treated by other multi-core integrated circuits as a shared I/O pin.

* * * * *